United States Patent [19]

Burtscher et al.

[11] 4,079,406

[45] Mar. 14, 1978

[54] THYRISTOR HAVING A PLURALITY OF EMITTER SHORTS IN DEFINED SPACIAL RELATIONSHIP

[75] Inventors: Joachim Burtscher; Helmut Strack, both of Munich, Germany

[73] Assignee: Siemens Aktiengesellschaft, Berlin & Munich, Germany

[21] Appl. No.: 749,171

[22] Filed: Dec. 9, 1976

Related U.S. Application Data

[63] Continuation-in-part of Ser. No. 600,555, Jul. 31, 1975, abandoned.

[30] Foreign Application Priority Data

Aug. 13, 1974 Germany ............................ 2438894

[51] Int. Cl.² ........................................... H01L 29/74
[52] U.S. Cl. ...................................... 357/38; 357/20; 357/86
[58] Field of Search ....................... 357/38, 39, 20, 86

[56] References Cited

U.S. PATENT DOCUMENTS

| 3,277,352 | 10/1966 | Hubner | 357/38 |
| 3,476,992 | 11/1969 | Chu | 357/38 |
| 3,589,937 | 6/1971 | Raithel et al. | 357/38 |
| 3,599,061 | 8/1971 | Kokosa | 357/38 |

Primary Examiner—Stanley D. Miller, Jr.
Assistant Examiner—Joseph E. Clawson, Jr.
Attorney, Agent, or Firm—Hill, Gross, Simpson, Van Santen, Steadman, Chiara & Simpson

[57] ABSTRACT

A thyristor device is provided with a shorted emitter structure in which the shorts are circularly formed zones of the base zone which extend through the emitter zone into electrical contact with the emitter electrode. Each of these zones is circular in cross-section and of a diameter which is less than 20μm. These zones have a spacing from each other from center to center which is such that the ratio of this spacing to the diameter of a circular area is greater than 3.

2 Claims, 3 Drawing Figures

THYRISTOR HAVING A PLURALITY OF EMITTER SHORTS IN DEFINED SPACIAL RELATIONSHIP

CROSS-REFERENCE TO RELATED APPLICATIONS

This application is a continuation-in-part of our application Ser. No. 600,555, filed July 31, 1975, now abandoned, assigned to the same assignee as the present application.

BACKGROUND OF THE INVENTION

1. Field of the Invention

The present invention relates to four region semiconductor switching devices and more particularly to fast switching thyristors.

2. Description of the Prior Art

Four region semiconductor switching devices, known as thyristors, have previously been constructed with shorted emitters. It is known to construct a thyristor with a semiconducting body having at least one external emitter zone and an adjacent base zone which is electrically connected with an emitter electrode associated with the emitter zone via a plurality of shorts located in the emitter zone.

The purpose of the above-mentioned shorts is to improve the $dv/dt$ behavior of the thyristor. The improvement in the $dv/dt$ behavior occurs since part of the electrons flowing to the emitter zone, on the application of a voltage to the thyristor, flow directly to the emitter electrode via the shorts without giving rise to an emission of charge carriers from the emitter zone. On firing, or triggering, with an applied voltage, an emission of charge carriers from the emitter zone sets in at higher $dv/dt$ values in the case of thyristors with a shorted emitter area, than in thyristors with a small shorted emitter area. At the same time, there is an increase in the value of the thyristor current at which the thyristor is switched into to the conducting state without a fed-in control current. This current is termed the "break-over current" $i^{(bo)}$.

In order to improve the $dv/dt$ behavior or to increase the value of the current $i^{(bo)}$, the shorted area can be increased, for example, by increasing the diameter of the short. However, the shorts cause a hindrance for the propagation of the firing process emanating from the emitter edge adjacent the control electrode. As a result, the spread of the firing process is strongly restrained by increasing the shorted area. In addition, the voltage drop in the forward (conducting) direction of the thyristor would become relatively high on account of the relatively small igniting area.

The basic task of the invention is to improve a thyristor of the above-mentioned type in such a way that the $dv/dt$ behavior is improved, the current $i^{(bo)}$ is increased, and the turn-off time is reduced without raising the forward voltage or appreciably impairing the spread of the firing process.

The present invention is based on the fact that these objectives can be achieved via a scaling down of the shorted emitter, that is, by a size reduction and an increase in the shorts at a constant ratio of short diameter to the distance of the shorts from each other.

The invention is characterized by the fact that the shorts have a diameter "$d$" of $<20$ $\mu$m, and by the fact that the ratio of the distance "$a$" between two adjacent shorts to their respective diameter is $>3$.

A thyristor has already been described in the prior art in which the diameter of the shorts lies between 5 and 15 $\mu$m. However, nothing is said concerning the distance between two neighboring shorts. A thyristor has also been described for which not only is the diameter of the shorts given, but also their spacing. In this case, however, the diameters of the shorts lie between 100 and 200 $\mu$m and the distance between them is about 1 mm.

SUMMARY OF THE INVENTION

We have found that two conditions must prevail in order to get greatly improved research. Specifically, we have found that the diameter of the shorts as well as the lateral spacing of the shorts must be of a particular magnitude.

More specifically, our invention pertains to a thyristor device comprising a body of semiconductor material and electrical contact means; the body of semiconductor material being comprised of zones of alternate semiconductivity disposed in PN junction forming relationships, an emitter zone of a first type of semiconductivity disposed at a top surface of the body, a base zone of a second type of semiconductivity disposed in the body beneath the emitter zone, a plurality of small base portions of the second type of semiconductivity disposed in the emitter zone adjoining the base zone and extending from the base zone through the emitter zone to the top surface of the body, said small base portions forming circular shaped areas of a preferred diameter at the top surface of the body, said circular shaped areas having centers located at preferred points on the surface of the body such that the centers of adjacent circular shaped areas are separated by a like distance, a ratio of said like distance to said preferred diameter being greater than 3; and their diameter less than 20 $\mu$m; said electrical contact means comprising an emitter electrode affixed to the top surface of the body, said emitter electrode electrically contacting both the emitter zone and the circular shaped areas of said small base portions.

DESCRIPTION OF THE PREFERRED EMBODIMENTS

The invention will now be explained in detail on the basis of a practical example in association with appended drawings 1 to 3.

Figure 1:
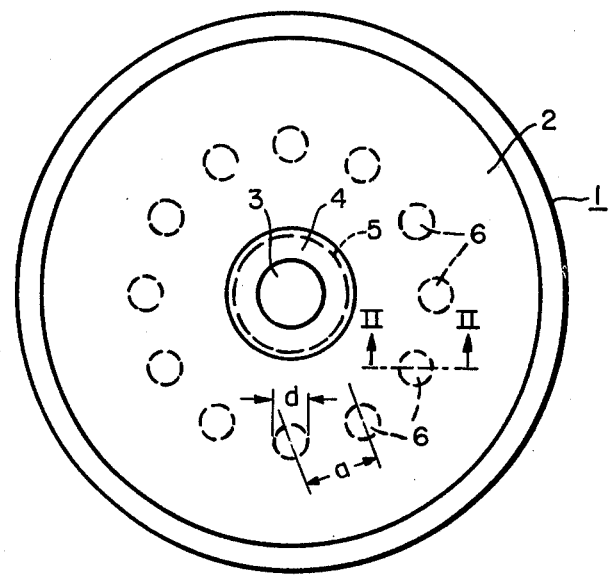
FIG. 1 presents a plan-view of part of a thyristor device.

In FIG. 1, a body 1 of semiconductor material comprising a portion of a thyristor is provided with an emitter electrode 2 which is electrically connected with an emitter zone 5 of N-type semiconductivity in the body 1. An adjacent base zone 4 of P-type semiconductivity lies below emitter zone 5 and forms a PN junction therewith. The base is electrically connected with a control electrode 3. In emitter zone 5 are provided shorts 6 of P-type semiconductivity which, in the example of this embodiment, form a concentric circle around the control electrode 3. However, shorts 6 can be arranged in other ways. The base zone 4 is electrically connected to emitter electrode 2 via shorts 6. The distance between any two adjacent shorts 6 is denoted by $a$, and the diameters of the shorts by $d$.

Figure 2:
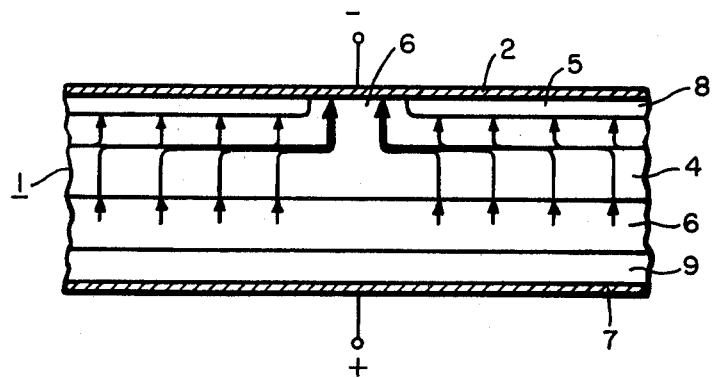
FIG. 2 shows, in enlarged cross-section, part of the device shown in FIG. 1, taken along the line II—II.

FIG. 2 illustrates how the diameter $d$ of the shorts 6 has an influence on the $dv/dt$ behavior and on the current $i^{(bo)}$. This figure illustrates, on an enlarged scale, a portion of the thyristor device of FIG. 1 along the line II—II. Parts which are the same as in FIG. 1 are given by the same identifying numbers. In FIG. 2, anode electrode 7 is affixed to anode emitter region 9, above which lies anode base zone 8. If a voltage of the polarity shown in applied to electrodes 2 and 7 of the thyristor, a current builds up whose flow corresponds to that indicated by the arrows. Starting essentially from anode base zone 8, this current flows in an axial direction to the emitter electrode 2. It then flows under the emitter zone 5 on account of the highest doping in that locality, the current flowing in a lateral direction to the short 6 and from there into the emitter electrode 2. This current produces a voltage drop below emitter zone 5 which, referred to the potential of emitter electrode 2, is greatest on the outer periphery 10 of emitter zone 5. The thyristor will fire at this place if the voltage drop exceeds a specified value which, for silicon thyristors, is about 0.4V. If the diameter of short 6 is made larger, the voltage drop under emitter zone 5 will decrease on account of the lateral current density decreasing with increasing circumference of the short. As a result, the $dv/dt$ behavior actually improves and the current $i^{(bo)}$ increases. However, the spread of the firing becomes appreciably slower and the forward voltage rises. If the diameter of the shorts 6 were reduced, the spread of the firing would be less adversely affected and the forward voltage of the thyristor would drop accordingly, but the $dv/dt$ behavior would be poorer and the current $i^{(bo)}$ would be smaller.

Optimum $dv/dt$ properties, larger $i^{(bo)}$ currents and simultaneously good firing propagation and low forward voltage are attainable along with a fast turn-off time when the diameter of each short is made $<20$ $\mu$m, and when the ratio of the distance between the centers of two adjacent shorts to their diameter is $>3$.

Figure 3:
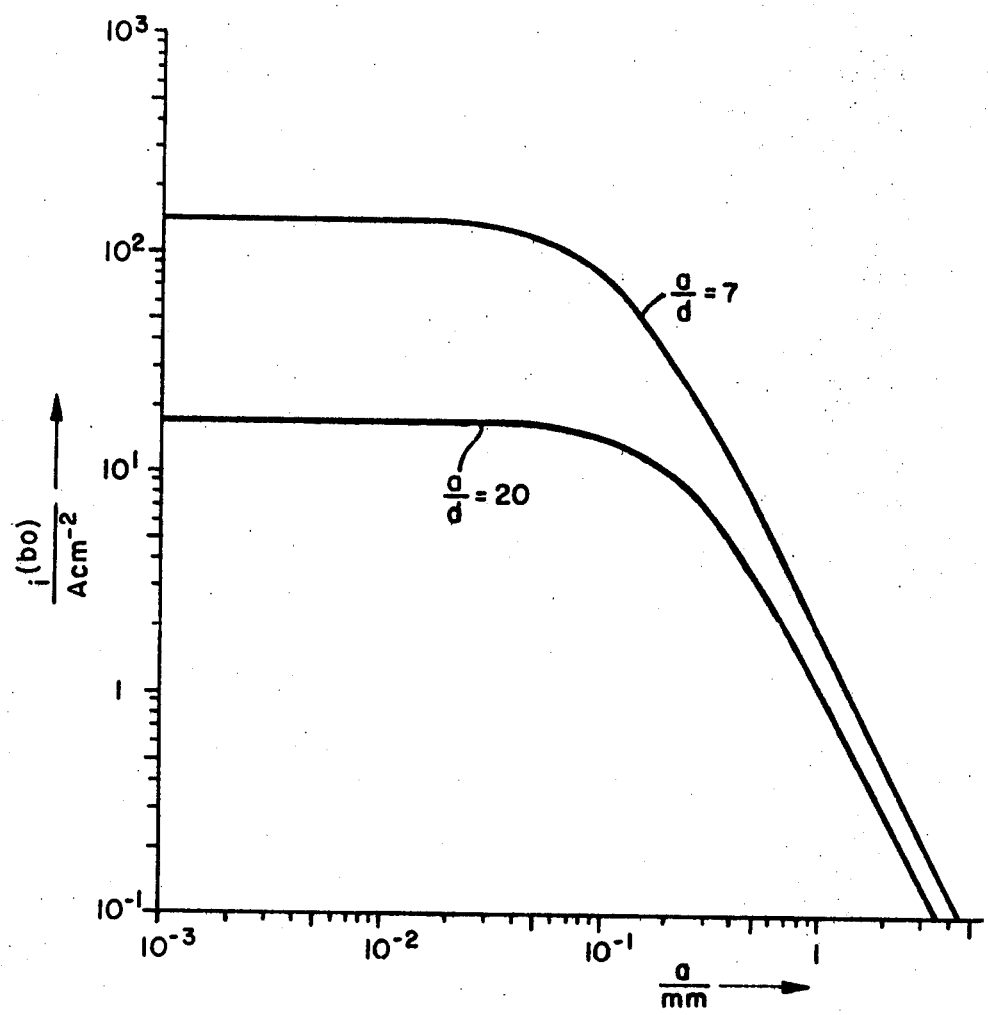
FIG. 3 shows a graph in which is plotted the current $i^{(bo)}$ as a function of the distance between the shorts, with the ratio ($a/d$) of such distance to the diameter of the shorts as a parameter.

The graph presented in FIG. 3 illustrates how the values indicated above were determined. The stated values are essential, as can be deduced from FIG. 3. On both curves a diameter of the short of 20 $\mu$m can be entered. In the curve $a/d = 7$ this point is determined by a distance $a = 140$ $\mu$m, and in the curve $a/d = 20$ by a distance $a = 400$ $\mu$m. It can be seen clearly that the points $d = 20$ $\mu$m mark the beginning of a section of the curves, in which said curves become steeper and steeper with increasing diameters, i.e., that an increasing of the diameters of the short circuits above 20 $\mu$m involves a great decrease of the current $i^{(bo)}$. By the current $i^{(bo)}$, that current through the semiconductor component is to be understood, in which said component transfers into a conductive state without applying a control current. Now it is desirable that this current be as great as possible, since therewith the insensitivity against steeply increasing currents on the semiconductor component increases. The diameter of the shorts, therefore, should be smaller than 20 $\mu$m. This demonstrates how the $dv/dt$ characteristics, as a function of the distance between the shorts and the ratio of the distance between the shorts to their diameter are used as a parameter. It can be seen that, for decreasing values of the distance between the shorts with a constant distance to diameter ratio, the current $i^{(bo)}$ remains constant as the distance "$a$" decreases. It is further evident that the current $i^{(bo)}$ decreases for larger values of $a/d$. Thus, the current $i^{(bo)}$ is considerably higher for the ratio $a/d = 7$ than for the ratio $a/d = 20$. It is undesirable to go below the ratio $a/d = 3$ because the shorted emitter area will already be about 10%. The ultilization of the thyristor area would then become very poor.

The lower significant limit of the diameters of the shorts is set by the transition of the curves to the horizontal. It is advisable to effect the doping of the emitter zone and the shorts by known ion implantation methods followed by diffusion. By this means, it is possible to obtain a homogeneous emitter zone in the lateral direction which has an additional positive effect on the uniformity of the firing operation. Consequently, with the presently employed photo-masking technique, it is advisable to make the lower value of the diameter of the shorts larger than the thickness of the N-type emitter zone.

On the other hand, the lower practical meaningful diameter is set by the technology employed in producing the emitter and the shorts. For example, on account of the all-around spread of the diffusion front, as well as under the masks for the shorts, it is very difficult to produce shorts with diameters which are smaller than the depth of penetration of the emitters.

It should also be appreciated that the diagram shown in FIG. 3 applies to a certain doping profile in the base zone. For steeper profiles, for example, the values of the current $i^{(bo)}$ change in the direction which makes the current $i^{(bo)}$ lower in the faling part of the curve.

With the invention, better characteristics are obtained by comparison with previously known thyristors for the same parameters for diameter and distance between shorts. Thus, for example, with a conventional type of thyristor with a blocking voltage of about 2000 V, short diameters of 300 $\mu$m and distances between shorts of 2 mm, a maximum $dv/dt$ of 500 V/$\mu$s was measured, whereas with a thyristor having the same construction, but with short diameters of 20 $\mu$m and short-to-short distances of 250 $\mu$m, a maximum $dv/dt$ of about 5000 V/$\mu$s was attained. In addition, the turn-off time was lower by a factor of 3, the forward voltage was about the same, and the firing propagation speed was only about 30% below the value for conventional thyristors.

It will be apparent to those skilled in the art that many modifications and variations may be effected without departing from the spirit and scope of the novel concepts of the present invention.

We claim as our invention:

1. A thyristor device comprising a body of semiconductor material and electrical contact means; said body of semiconductor material comprising zones of alternate semiconductivity disposed in PN junction forming relationships, an emitter zone of a first type of semiconductivity disposed at a top surface of the body, a base zone of a second type of semiconductivity disposed in the body beneath the emitter zone, a plurality of small base portions of said second type of semiconductivity disposed in the emitter zone adjoining the base zone and extending from the base zone through the emitter zone to the top surface of the body, said small base portions forming circular shaped areas at the top surface of the body, the diameter of each of said circular shaped areas being less than 20 microns, said circular shaped areas having centers located at preferred points on the surface of the body such that the centers of adjacent circular shaped areas are separated from each other by a like distance, the ratio of said like distance to said diameter of said circular shaped areas being greater than 3; said electrical contact means comprising an emitter electrode affixed to the top surface of said body, in electrical contact with the emitter zone and the circular shaped areas of said small base portions.

2. A thyristor device according to claim 1 in which said emitter zone has a thickness less than said diameter of said circular shaped areas.

* * * * *